(12) United States Patent
Heck et al.

(10) Patent No.: US 8,435,809 B2
(45) Date of Patent: May 7, 2013

(54) VERTICAL MIRROR IN A SILICON PHOTONIC CIRCUIT

(75) Inventors: John Heck, Berkeley, CA (US);
Ansheng Liu, Cupertino, CA (US);
Michael T. Morse, San Jose, CA (US);
Haisheng Rong, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 671 days.

(21) Appl. No.: 12/567,601

(22) Filed: Sep. 25, 2009

(65) Prior Publication Data

US 2011/0073972 A1 Mar. 31, 2011

(51) Int. Cl.
*H01L 21/00* (2006.01)

(52) U.S. Cl.
USPC .................... 438/29; 438/31; 438/39; 438/40

(58) Field of Classification Search ............... 438/29, 438/31, 39, 40
See application file for complete search history.

(56) References Cited

U.S. PATENT DOCUMENTS 5,260,588 A  11/1993  Ohta et al.

FOREIGN PATENT DOCUMENTS

| CN | 101191871 A | 6/2008 |
|---|---|---|
| JP | 04-343484 A | 11/1992 |
| JP | 08-046292 A | 2/1996 |
| JP | 11-191654 A | 7/1999 |
| WO | 2011/037742 A2 | 3/2011 |
| WO | 2011/037742 A3 | 6/2011 |

OTHER PUBLICATIONS

International Preliminary Report received for PCT Patent Application No. PCT/US2010/047987, mailed on Apr. 5, 2012, 7 pages.
Office action received for Chinese Patent Application No. 201010294280.3, mailed on Jul. 31, 2012, 5 pages of Chinese office action and 4 pages of English Translation.
Strandman et al. "Fabrication of 45° mirrors together with well-defined v-grooves using wet anisotropic etching of silicon", Journal of Microelectromechanical Systems, vol. 4, No. 4, Dec. 1995, pp. 213-219, Abstract Only.
International Search Report and Written Opinion received for PCT Patent Application No. PCT/US2010/047987, mailed on May 2, 2011, 9 pages.

*Primary Examiner* — Samuel Gebremariam
(74) *Attorney, Agent, or Firm* — Kevin A. Reif

(57) ABSTRACT

A vertical total internal reflection (TIR) mirror and fabrication thereof is made by creating a re-entrant profile using crystallographic silicon etching. Starting with an SOI wafer, a deep silicon etch is used to expose the buried oxide layer, which is then wet-etched (in HF), opening the bottom surface of the Si device layer. This bottom silicon surface is then exposed so that in a crystallographic etch, the resulting shape is a re-entrant trapezoid with facets These facets can be used in conjunction with planar silicon waveguides to reflect the light upwards based on the TIR principle. Alternately, light can be coupled into the silicon waveguides from above the wafer for such purposes as wafer level testing.

15 Claims, 2 Drawing Sheets

VERTICAL MIRROR IN A SILICON PHOTONIC CIRCUIT

FIELD OF THE INVENTION

Embodiments of the present invention are directed to photonic circuits and, more particularly, to a vertical mirror in a photonic circuit for directing light normal to the surface of the circuit.

BACKGROUND INFORMATION

Silicon photonic circuits generally route optical signals in planar waveguides, and it is difficult to provide a path for light to enter/exit the circuits vertically. Routing light in or out of the wafer surface can be valuable for several reasons, such as coupling into a normal-incidence photodetector on the wafer surface, for wafer-level optical test/characterization, or other potential applications.

Of particular interest is the integration of planar silicon waveguides with Ge-based photodetectors. This is being addressed in several ways, all of which have various challenges. Planar photodetectors, in which the Ge is grown on top of the Si waveguide are quite large, because the optical coupling is inefficient and a long distance is needed for sufficient coupling of light to occur from the Si to the Ge.

To avoid this difficulty, trench sidewall photodetectors have been proposed, where the waveguide is terminated by a vertical facet. In this case, a facet with sufficient smoothness is difficult to form, and the epitaxial growth of the Ge-based photodetector can be very challenging.

Another area of interest is that of wafer-level optical testing. Currently, silicon photonic die must be singulated and have the edges polished in order to do optical testing; this is an expensive and time consuming process. The vertical mirror would enable rapid and inexpensive optical testing at the wafer level, dramatically reducing development times and testing costs.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Described is an apparatus and method comprising a total internal reflection (TIR) mirror that reflects light from planar silicon waveguides into the direction normal to the wafer surface (and vice-versa), enabling many such applications.

Embodiments described herein comprise a vertical TIR mirror and fabrication method thereof. The mirror may be made by creating a re-entrant profile using crystallographic silicon etching. Starting with an silicon on insulator (SOI) wafer, a deep silicon etch is used to expose the buried oxide layer, which is then wet-etched, opening the bottom surface of the Si device layer. This bottom silicon surface is then exposed so that in a crystallographic etch, the resulting shape is a re-entrant trapezoid with facets approximately 54° to the normal direction. These facets may be used in conjunction with planar silicon waveguides to reflect the light upwards based on the TIR principle. Alternately, light can be coupled into the silicon waveguides from above the wafer.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
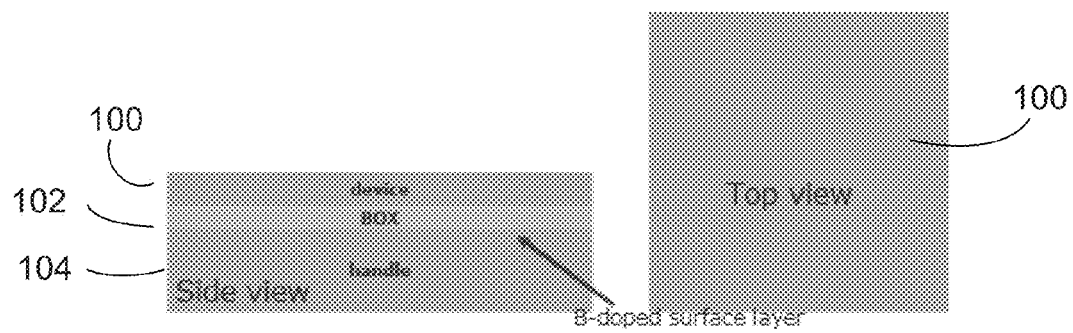
FIG. 1 comprises side-by-side side and top views of a wafer illustrating the fabrication steps for creating a total internal reflection (TIR) mirror device.

Referring now to FIG. 1, there is shown a top view and a side view of one embodiment of the inventive device in the first stages of fabrication. A device fabrication wafer (100) 100, comprising a silicon on insulator (SOI) wafer, sits atop a buried oxide layer (BOX) 102 on a handle wafer 104. The handle wafer 104 may be heavily boron-doped (~$10^{20}$ cm$^{-3}$) by implantation to prevent later etching.

Figure 2:
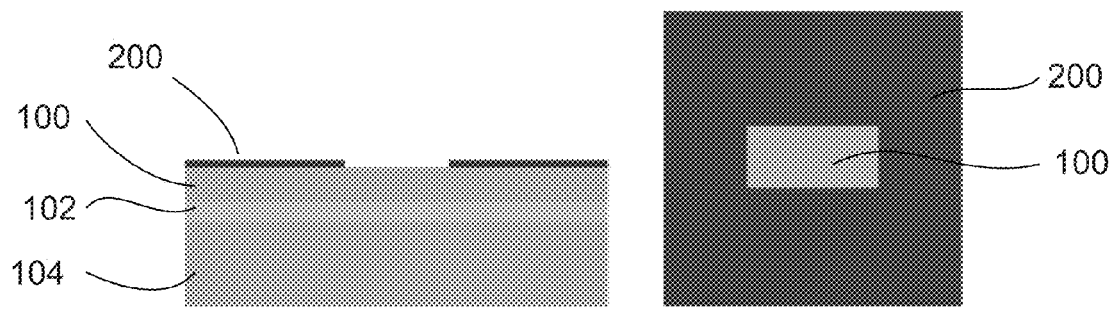
FIG. 2 comprises side-by-side side and top views of a wafer illustrating the fabrication steps for creating a TIR mirror device coated with a nitride layer.
Figure 3:
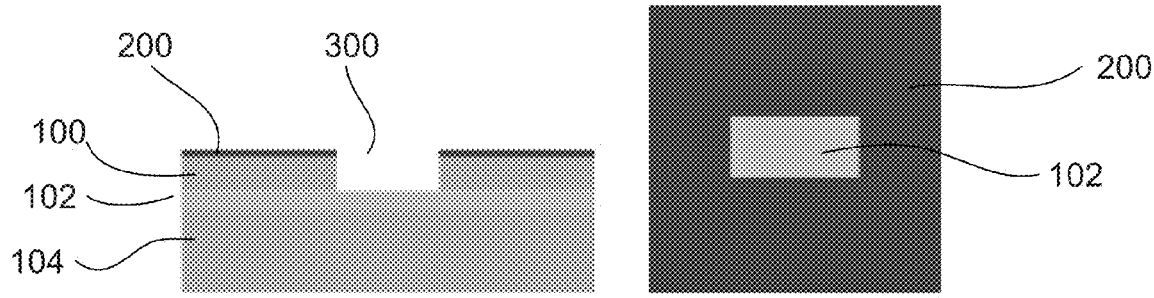
FIG. 3 comprises side-by-side side and top views of a wafer illustrating the fabrication steps for creating a TIR mirror device having an etched trench.
Figure 4:
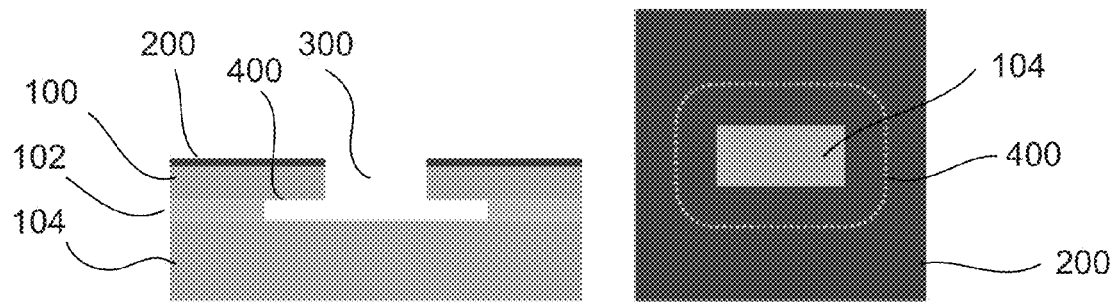
FIG. 4 comprises side-by-side side and top views of a wafer illustrating the fabrication steps for creating a TIR mirror device having an undercut area.

FIG. 2 shows the device wafer 100 having a nitride layer 200 patterned on its surface. As shown in FIG. 3, the Si wafer 100 may be etched down to the buried oxide (BOX) 102 to create a trench 300 using, for example a deep reactive ion etch (DRIE). In FIG. 4, the oxide layer 102 may be etched, such as by, for example, a wet etch in hydrofluidic acid (HF) to create an undercut area 400 beneath the Si device layer 100.

Figure 5:
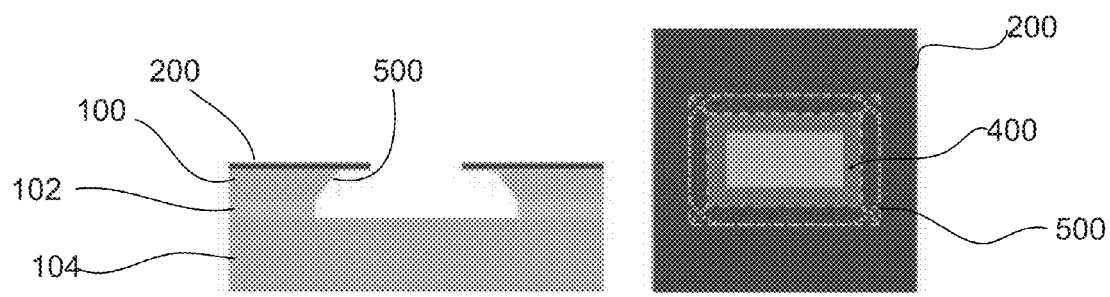
FIG. 5 comprises side-by-side side and top views of a wafer illustrating the fabrication steps for creating a TIR mirror device showing the trapezoidal region including a facet in the Si layer on the (111) plane.

Referring now to FIG. 5, the wafer 100 may be immersed in a crystallographic etchant such as potassium hydroxide (KOH). In some embodiments, ammonium hydroxide (NH$_4$OH), ethylene diamene pyrocatechol (EDP) or tetramethyl ammonium hydroxide (TMAH) may be used. The bottom of the device layer 100 is exposed to the etchant, creating an inverted trapezoidal shape with a 54.7° angle to the normal. This angle may also be tuned by changing the etch conditions, such as composition or temperature, potentially creating a 45° facet. The etch terminates at the top silicon nitride layer 200. Assuming the handle wafer 104 is boron-doped as described earlier, it will not etch during this step; otherwise there will be a similar trapezoidal recess going downward into the handle wafer 100.

Figure 6:
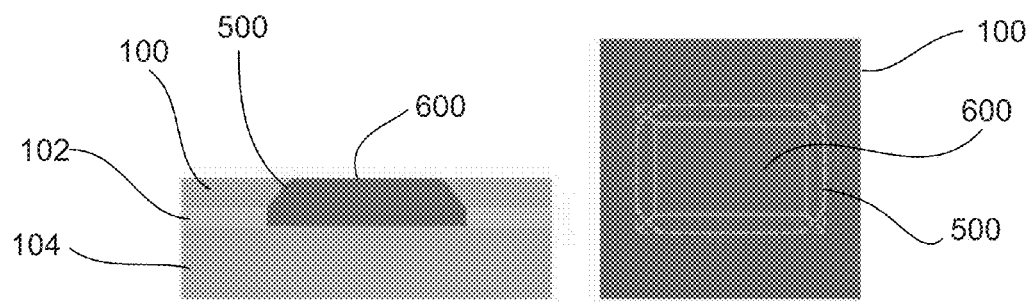
FIG. 6 comprises side-by-side side and top views of a wafer illustrating the fabrication steps for creating a TIR mirror device after replanerization.

As shown in FIG. 6, the nitride layer 200 may be optionally removed to eliminate any overhang as shown in FIG. 5. The wafer 100 may be re-planarized by depositing and reflowing a thick oxide layer 600, for example. Alternately a polymeric material may be used for replanarization. Embodiments avoid the above challenges discussed above by creating an ultra-smooth mirror 500 defined by a re-entrant (111) crystal plane of the Si wafer 100, which reflects the light upward; thus optical signals can be coupled efficiently to the wafer surface.

Figures 7A, 7B:
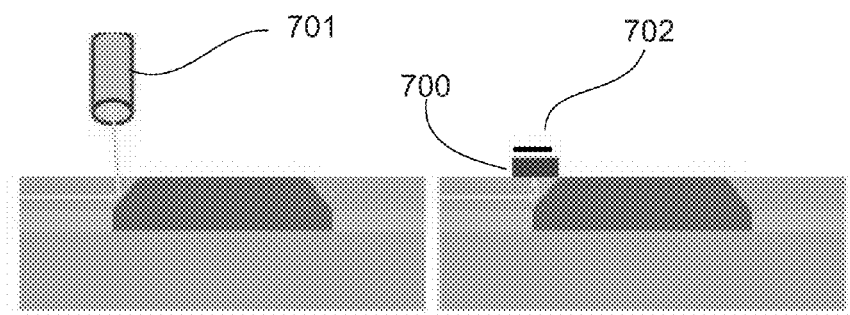
FIGS. 7A and 7B illustrate the TIR mirror device used in a wafer-level test system and having a photodetector fabricated thereon, respectively.

At this point, the re-entrant TIR mirror 500 has been made, and the silicon photonic devices can be tested at the wafer level as illustrated in FIG. 7A. These mirrors 500 can be used in conjunction with planar silicon waveguides to reflect the light upwards based on the TIR principle. Alternately, light can be coupled into the silicon waveguides from above the wafer. Wafer-level optical test systems 701 can be utilized for batch testing without the need for cleaving and polishing before optical tests can be performed.

Alternately, as shown in FIG. 7B, a photodetector 700 may be formed on the surface of the wafer 100, positioned above the mirror 500. Such compact Ge photodetectors can be fabricated using standard surface processing, and furthermore a mirror 702, such as made from an aluminum or gold layer, may easily be fabricated on top of the photodetector, enabling a doubling in the detection efficiency as light passes through the Ge layer twice.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for forming a mirror in a silicon photonic circuit, comprising:
   providing a handle wafer;
   forming a buried oxide (BOX) layer on the handle wafer;
   providing a device wafer comprising a silicon on insulator (SOI) wafer on the BOX layer;
   depositing a nitride layer on the device wafer;
   etching a trench in the device wafer to expose the BOX layer;
   etching the BOX layer to create an undercut beneath the device layer;
   immersing in an etchant to fill the trench creating a trapezoidal shape from the trench and undercut areas with the device layer comprising a facet; depositing and reflowing a thick oxide layer in the trench; and
   replanerizing the device wafer, wherein the facet comprises a re-entrant total-internal-reflection (TIR) mirror.

2. The method as recited in claim 1 wherein the facet comprises an angle 54 degrees to 45 degrees to the normal.

3. The method as recited in claim 1 wherein the trench is etched by deep reactive ion etching (DRIE).

4. The method as recited in claim 1 wherein the buried oxide (BOX) is etched with hydrofluoric acid (HF).

5. The method as recited in claim 1 wherein the etchant to form the trapezoidal shape comprises potassium hydroxide (KOH).

6. The method as recited in claim 1 wherein the etchant to form the trapezoidal shape comprises ammonium hydroxide ($NH_4OH$).

7. The method as recited in claim 1 wherein the etchant to form the trapezoidal shape comprises ethylene diamene pyrocatechol (EDP).

8. The method as recited in claim 1 wherein the etchant to form the trapezoidal shape comprises tetramethyl ammonium hydroxide (TMAH).

9. The method as recited in claim 1 wherein the device waver comprises a (100) crystal plane wafer.

10. The method as recited in claim 9 wherein the facet comprises a (111) crystal plane of the device wafer.

11. The method as recited in claim 1, further comprising:
    doping the handle wafer with a dopant selected to prevent trapezoidal etching of the handle wafer.

12. The method as recited in claim 11 wherein the boron concentration is approximately $10^{20}$ $cm^{-3}$.

13. The method as recited in claim 11, wherein no dopant is used in the handle wafer, and the anisotropic etchant forms a trapezoidal or pyramidal etch pit in the handle wafer.

14. The method as recited in claim 1 further comprising;
    forming a Ge photodetector on the device wafer over the facet.

15. The method as recited in claim 14 further comprising:
    forming a mirror on top of the photodetector to cause light to pass through the Ge photodetector twice.

* * * * *

UNITED STATES PATENT AND TRADEMARK OFFICE
CERTIFICATE OF CORRECTION

| | |
|---|---|
| PATENT NO. | : 8,435,809 B2 |
| APPLICATION NO. | : 12/567601 |
| DATED | : May 7, 2013 |
| INVENTOR(S) | : Heck et al. |

It is certified that error appears in the above-identified patent and that said Letters Patent is hereby corrected as shown below:

Specification

Please insert in column 1, line 4 before FIELD OF THE INVENTION:

--STATEMENT OF GOVERNMENT INTEREST

This invention was made with Government support under contract number H98230-08-3-0011 awarded by the Department of Defense. The Government has certain rights in this invention.--

Signed and Sealed this
First Day of December, 2015

Michelle K. Lee
*Director of the United States Patent and Trademark Office*